United States Patent
Lambert et al.

(10) Patent No.: US 10,866,006 B2
(45) Date of Patent: Dec. 15, 2020

(54) SYSTEMS AND METHODS FOR FAN TYPING AND ANOMALY DETECTION

(71) Applicant: Dell Products L.P., Round Rock, TX (US)

(72) Inventors: Timothy M. Lambert, Austin, TX (US); Sandor T. Farkas, Round Rock, TX (US); Robert B. Curtis, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/017,222

(22) Filed: Jun. 25, 2018

(65) Prior Publication Data

US 2019/0390864 A1    Dec. 26, 2019

(51) Int. Cl.
*F24F 11/38* (2018.01)
*F24F 11/52* (2018.01)
(Continued)

(52) U.S. Cl.
CPC .............. *F24F 11/38* (2018.01); *F24F 11/52* (2018.01); *F24F 11/64* (2018.01); *H02P 27/026* (2013.01); *H02P 27/08* (2013.01); *H05K 7/20209* (2013.01)

(58) Field of Classification Search
CPC .. F24F 11/38; F24F 11/64; F24F 11/52; H02P 27/026; H05K 7/20209; H05K 7/20718; H05K 7/20836
(Continued)

(56) References Cited

U.S. PATENT DOCUMENTS 6,262,400 B1 * 7/2001 Urbank ................ B60H 1/2218
                                                   219/202
6,428,282 B1 * 8/2002 Langley ................ F04D 27/004
                                                   417/2
(Continued)

FOREIGN PATENT DOCUMENTS

CN    1811197    *  8/2006  ............. F04D 29/64
CN    1913334    *  2/2007  ............... G05F 1/56
(Continued)

OTHER PUBLICATIONS 1-of-8 Fet Multiplexer/Demultiplexer 2.5-V/3.3-V Low-Voltage High-Bandwidth Bus Switch, SN74CB3Q3251, Revised Mar. 2005, Texas Instruments www.ti.com; 21 pages.
(Continued)

*Primary Examiner* — Emilio J Saavedra
(74) *Attorney, Agent, or Firm* — Baker Botts L.L.P.

(57) ABSTRACT

Systems and methods for fan typing and anomaly detection may provide a pulse width modulation (PWM) control signal with a predetermined threshold duty cycle to a fan, receive a tachometer signal from the fan while the PWM control signal has the threshold duty cycle, and compare the frequency of the tachometer signal (expressed in revolutions per minute) to an expected tachometer frequency for fans of a first fan type with the PWM control signal having the threshold duty cycle, according to an RPM vs. PWM curve specified for fans of the first fan type. The systems and methods may determine, based on the comparison, that the fan is of the first fan type and provide an indication that the fan is of the first fan type to a fan controller. Deviations from expected tachometer responses may indicate an anomaly, such as an actual fan failure or a predicted fan failure.

14 Claims, 8 Drawing Sheets

(51) Int. Cl.
*H02P 27/02* (2016.01)
*F24F 11/64* (2018.01)
*H05K 7/20* (2006.01)
*H02P 27/08* (2006.01)

(58) Field of Classification Search
USPC .............................................. 700/21
See application file for complete search history.

(56) References Cited

U.S. PATENT DOCUMENTS

| | | | | |
|---|---|---|---|---|
| 2004/0009074 | A1* | 1/2004 | Dodson, III | F04D 27/004 417/22 |
| 2004/0257024 | A1* | 12/2004 | Marando | G01P 3/481 318/647 |
| 2005/0077849 | A1* | 4/2005 | Chuan-Fa | H02P 7/29 318/268 |
| 2005/0238336 | A1* | 10/2005 | Bekker | G01P 3/48 388/829 |
| 2006/0117779 | A1* | 6/2006 | Liebenow | G01K 13/00 62/259.2 |
| 2006/0152891 | A1* | 7/2006 | Jreij | H05K 7/20209 361/676 |
| 2007/0019383 | A1* | 1/2007 | Chang | G06F 1/20 361/695 |
| 2007/0098374 | A1* | 5/2007 | Fujiwara | G06F 1/20 318/66 |
| 2007/0108923 | A1* | 5/2007 | Chen | G06F 1/20 318/66 |
| 2007/0201612 | A1* | 8/2007 | Teng | H05K 7/20209 378/19 |
| 2007/0229291 | A1* | 10/2007 | Kuo | G06F 1/20 340/584 |
| 2008/0007194 | A1* | 1/2008 | Mace | H02P 1/04 318/625 |
| 2008/0165482 | A1* | 7/2008 | Kim | G09G 5/003 361/679.21 |
| 2009/0003806 | A1* | 1/2009 | Zou | H02P 6/08 318/471 |
| 2009/0169188 | A1* | 7/2009 | Huang | H05K 7/20209 388/811 |
| 2009/0289590 | A1* | 11/2009 | Huang | H02P 6/08 318/471 |
| 2010/0007795 | A1* | 1/2010 | Ouyang | G09G 3/2096 348/572 |
| 2011/0093109 | A1* | 4/2011 | Scheid Budzinski | G06Q 10/06 700/109 |
| 2011/0156630 | A1* | 6/2011 | Shen | G06F 1/20 318/490 |
| 2011/0199034 | A1* | 8/2011 | Wu | G06F 1/206 318/471 |
| 2012/0035769 | A1* | 2/2012 | Lin | G05B 11/28 700/275 |
| 2013/0054047 | A1* | 2/2013 | Uhlmann | G06F 1/206 700/300 |
| 2013/0079626 | A1* | 3/2013 | Shmatukha | A61B 6/03 600/420 |
| 2014/0028292 | A1* | 1/2014 | Huang | G01P 3/489 324/166 |
| 2014/0192475 | A1* | 7/2014 | Tunks | H05K 7/20836 361/679.31 |
| 2014/0310039 | A1* | 10/2014 | Casey | G08G 1/0125 701/117 |
| 2015/0170514 | A1* | 6/2015 | Stenneth | G08G 1/0125 701/117 |
| 2016/0144713 | A1* | 5/2016 | Verheijen | B60R 16/0236 701/123 |
| 2016/0239067 | A1* | 8/2016 | Lovicott | G06F 1/3206 |
| 2017/0061638 | A1* | 3/2017 | Schmalz | G07D 7/20 |
| 2017/0209339 | A1* | 7/2017 | Potucek | A61H 33/005 |
| 2018/0316289 | A1* | 11/2018 | Takemoto | H02P 6/12 |
| 2018/0373300 | A1* | 12/2018 | Bhatia | G06F 1/206 |

FOREIGN PATENT DOCUMENTS

| | | | | |
|---|---|---|---|---|
| CN | 101334673 | * | 12/2008 | F04D 27/00 |
| CN | 101443718 | * | 5/2009 | G05D 23/00 |
| CN | 103501690 | * | 1/2014 | A61B 5/00 |
| CN | 104763665 | * | 7/2015 | F04D 27/00 |
| CN | 105224047 | * | 1/2016 | G06F 1/20 |
| DE | 102008017555 | * | 10/2009 | F04D 27/00 |
| JP | 2008208806 | * | 9/2008 | F04D 27/00 |
| JP | 2013041093 | * | 2/2013 | G03G 21/00 |

OTHER PUBLICATIONS

Low-Voltage, CMOS Analog Multiplexers/Switches, Max4581/Max4582/Max4583, www.maxim-ic.com, 2012; 17 pages.

* cited by examiner

200

202
SUPPLY PWM CONTROL SIGNAL WITH A GIVEN DUTY CYCLE TO AN INPUT OF A FAN, THE GIVEN DUTY CYCLE BEING GREATER THAN OR EQUAL TO A PREDETERMINED THRESHOLD DUTY CYCLE

204
RECEIVE A TACHOMETER SIGNAL OUTPUT OF THE FAN WHILE THE PWM CONTROL SIGNAL HAS THE GIVEN PWM DUTY CYCLE

206
COMPARE FREQUENCY INDICATED BY THE TACHOMETER SIGNAL OUTPUT OF THE FAN TO AN EXPECTED FREQUENCY FOR FANS OF A GIVEN FAN TYPE CONTROLLED WITH THE GIVEN PWM DUTY CYCLE

208
DETERMINE, BASED ON THE COMPARISON, WHETHER OR NOT THE FAN IS A FAN OF THE GIVEN FAN TYPE

210
PROVIDE AN INDICATION OF WHETHER OR NOT THE FIRST FAN IS A FAN OF THE FIRST FAN TYPE TO A FAN CONTROLLER

FIG. 2

SYSTEMS AND METHODS FOR FAN TYPING AND ANOMALY DETECTION

BACKGROUND

Field of the Disclosure

This disclosure relates generally to information handling systems and, more particularly, to systems and methods for fan typing and anomaly detection.

Description of the Related Art

As the value and use of information continues to increase, individuals and businesses seek additional ways to process and store information. One option available to users is information handling systems. An information handling system generally processes, compiles, stores, and communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Various types of computer fans are used to provide cooling in information handling systems. For example, a server system may support the use of several different types of fans in a variety of configurations. The configuration of any given system may be based on criteria such as inventory, performance requirements, memory requirements, or the target environment, among other things. Different fan control mechanisms are used to balance tradeoffs between the cooling capacities of the fans and the noise they generate. Thermal controlled fans operate by sensing the temperature of computing devices and then increasing or decreasing the speed of the fan to regulate the temperature inside the system and prevent devices from failing due to overheating. Pulse-width modulation (PWM) is another common method of controlling computer fans. In a PWM-controlled fan, the speed is controlled by the fan based on a PWM control signal input, with the duty cycle of the PWM control signal determining the fan speed.

Recently, fan typing capabilities have been added to many motherboards and fan modules to differentiate standard fans from high performance fans. High performance fans may be optional in some applications but may be required in certain high power configurations. Typically, fan typing is provided using dedicated circuitry and wiring, and can only grossly determine the fan type. For example, the circuitry might only be able to determine whether or not a fan is present in a particular fan slot or whether an installed fan is, in general terms, a "high performance" fan or a "standard" fan with no additional specificity. The result of the fan type determination is sometimes provided to various sensors, configuration checking elements, and/or thermal control mechanisms.

SUMMARY

In one aspect, a disclosed information handling system includes at least one processor, and a memory medium coupled to the at least one processor and storing program instructions. When executed by the at least one processor, the program instructions cause the information handling system to supply a pulse width modulation (PWM) control signal with a first PWM duty cycle to an input of a given fan, the first PWM duty cycle being greater than or equal to a predetermined threshold duty cycle, receive a tachometer signal output by the given fan while the PWM control signal has the first PWM duty cycle, the tachometer signal including a pair of pulses for each rotation of the given fan such that the frequency of the tachometer signal expressed in terms of revolutions per minute (RPM) is proportional to the speed of the given fan, compare the frequency of the tachometer signal output by the given fan while the PWM control signal has the first PWM duty cycle to an expected tachometer frequency for fans of a first fan type when receiving a PWM control signal of the first PWM duty cycle, and responsive to determining, based on the comparison, that the given fan is a fan of the first fan type, provide an indication that the given fan is a fan of the first fan type to a fan controller.

In any of the disclosed embodiments, the first fan type may be an expected fan type for the given fan.

In any of the disclosed embodiments, the expected tachometer frequency may be dependent on a curve specified for fans of the first fan type on which tachometer frequency values expressed in terms of revolutions per minute are plotted against PWM duty cycle values.

In any of the disclosed embodiments, when executed by the at least one processor, the program instructions may further cause the information handling system to, responsive to determining, based on the comparison, that the given fan is not a fan of the first fan type compare, in a second comparison, the frequency of the tachometer signal output by the given fan while the PWM control signal has the first PWM duty cycle to an expected tachometer frequency for fans of a second fan type when receiving a PWM control signal of the first PWM duty cycle, and responsive to determining, based on the second comparison, that the given fan is a fan of the second fan type, provide an indication that the given fan is a fan of the second fan type to the fan controller.

In any of the disclosed embodiments, the information handling system may further include a plurality of fan slots, each fan slot being configured for installation of a respective fan into the fan slot. The given fan may be installed in a first one of the plurality of fan slots. When executed by the at least one processor, the program instructions may further cause the information handling system to compare the frequency of the tachometer signal output by the given fan while the PWM control signal has the first PWM duty cycle to a minimum tachometer frequency for fans of multiple fan types, and responsive to determining that the frequency of the tachometer signal output by the given fan while the PWM control signal is less than the minimum tachometer frequency for fans of multiple fan types, provide an indication of a potential failure or performance degradation of the given fan to the fan controller.

In any of the disclosed embodiments, when executed by the at least one processor, the program instructions may further cause the information handling system to calculate a first average frequency of the tachometer signal output by the given fan during a first time period in which the PWM control signal has the first PWM duty cycle, generate a first data structure representing a histogram including multiple bins, wherein each bin represents a respective range of tachometer frequency values for the tachometer signal output by the given fan during the first time period and each bin is associated with a respective count value indicating the number of occurrences of a tachometer frequency value for the tachometer signal falling within the respective range of tachometer frequency values represented by the bin during the first time period, determine a predetermined number of top bins associated with the highest respective count values in the first data structure, and save reference data representing one or more of the calculated average frequency, identifiers of the top bins in the first data structure, and the respective count values associated with the top bins. The program instructions may further cause the information handling system to calculate a second average frequency of the tachometer signal output by the given fan during a second time period in which the PWM control signal has the first PWM duty cycle, generate a second data structure representing a histogram including multiple bins, wherein each bin represents a respective range of tachometer frequency values for the tachometer signal output by the given fan during the second time period and each bin is associated with a respective count value indicating the number of occurrences of a tachometer frequency value for the tachometer signal falling within the respective range of tachometer frequency values represented by the bin during the second time period, determine a predetermined number of top bins associated with the highest respective count values in the second data structure, compare data representing one or more of the calculated second average frequency, identifiers of the top bins in the second data structure, and the respective count values associated with the top bins in the second data structure to the saved reference data, and responsive to detecting a discrepancy between the data representing the calculated second average frequency, identifiers of the top bins in the second data structure, or the respective count values associated with the top bins in the second data structure and the saved reference data, provide an indication of an anomaly associated with the given fan to the fan controller.

In another aspect, a disclosed method is for fan typing and anomaly detection. The method may include causing a pulse width modulation (PWM) control signal with a first PWM duty cycle to be provided to an input of a first fan, the first PWM duty cycle being greater than or equal to a predetermined threshold duty cycle, receiving a tachometer signal output by the first fan while the PWM control signal has the first PWM duty cycle, the tachometer signal including a pair of pulses for each rotation of the first fan such that the frequency of the tachometer signal expressed in terms of revolutions per minute (RPM) is proportional to the speed of the first fan, comparing the frequency of the tachometer signal output by the first fan while the PWM control signal has the first PWM duty cycle to an expected tachometer frequency for fans of a first fan type when receiving a PWM control signal of the first PWM duty cycle, determining, based on the comparison, whether or not the first fan is a fan of the first fan type, and providing an indication of whether or not the first fan is a fan of the first fan type to a fan controller.

In any of the disclosed embodiments, the first fan type may be an expected fan type for the first fan, and the method may further include obtaining an identifier associated with a hardware configuration of the information handling system, and determining the expected fan type based on the obtained identifier.

In any of the disclosed embodiments, the method may further include, in response to determining that the first fan is not a fan of the first fan type, comparing, by a second comparison, the frequency of the tachometer signal output by the first fan while the PWM control signal has the first PWM duty cycle to an expected tachometer frequency for fans of a second fan type when receiving a PWM control signal of the first PWM duty cycle, and in response to determining, based on the second comparison, that the first fan is a fan of the second fan type, providing an indication that the first fan is a fan of the second fan type to the fan controller.

In any of the disclosed embodiments, the method may further include calculating a first average frequency of the tachometer signal output by the first fan during a first time period in which the PWM control signal has the first PWM duty cycle, generating a first data structure representing a histogram including multiple bins, wherein each bin represents a respective range of tachometer frequency values for the tachometer signal output by the first fan during the first time period and each bin is associated with a respective count value indicating the number of occurrences of a tachometer frequency value for the tachometer signal falling within the respective range of tachometer frequency values represented by the bin during the first time period, determining a predetermined number of top bins associated with the highest respective count values in the first data structure, and saving reference data representing one or more of the calculated average frequency, identifiers of the top bins in the first data structure, and the respective count values associated with the top bins.

In any of the disclosed embodiments, the method may further include calculating a second average frequency of the tachometer signal output by the first fan during a second time period in which the PWM control signal has the first PWM duty cycle, generating a second data structure representing a histogram including multiple bins, wherein each bin represents a respective range of tachometer frequency values for the tachometer signal output by the first fan during the second time period and each bin is associated with a respective count value indicating the number of occurrences of a tachometer frequency value for the tachometer signal falling within the respective range of tachometer frequency values represented by the bin during the second time period, determining a predetermined number of top bins associated with the highest respective count values in the second data structure, comparing data representing one or more of the calculated second average frequency, identifiers of the top bins in the second data structure, and the respective count values associated with the top bins in the second data structure to the saved reference data, and in response to detecting a discrepancy between the data representing the calculated second average frequency, identifiers of the top bins in the second data structure, or the respective count values associated with the top bins in the second data structure and the saved reference data, providing an indication of an anomaly associated with the first fan to the fan controller.

In any of the disclosed embodiments, the method may further include determining that the anomaly associated with the first fan represents a failure or performance degradation of the first fan, and taking corrective action to mitigate the anomaly.

In any of the disclosed embodiments, the method may further include determining that the anomaly associated with the first fan is frequency-specific, and configuring the fan controller to avoid one or more frequencies associated with the anomaly.

In any of the disclosed embodiments, the method may further include, subsequent to determining that the first fan is a fan of the first fan type, causing a pulse width modulation (PWM) control signal with a second PWM duty cycle to be provided to an input of a second fan, the second PWM duty cycle being greater than or equal to the predetermined threshold duty cycle, receiving a tachometer signal output by the second fan while the PWM control signal has the second PWM duty cycle, comparing, in a second comparison, the frequency of the tachometer signal output by the second fan to an expected tachometer frequency for fans of a second fan type when receiving a PWM control signal of the second PWM duty cycle, determining, based on the second comparison, that the second fan is a fan of the second fan type, and providing an indication that the second fan is a fan of the second fan type to the fan controller.

In any of the disclosed embodiments, the method may further include prior to comparing the frequency of the tachometer signal output by the first fan to the expected tachometer frequency, ramping the PWM duty cycle of the PWM control signal up to the predetermined threshold duty cycle from an initial lower duty cycle, and subsequent to comparing the frequency of the tachometer signal output by the first fan to the expected tachometer frequency, returning the PWM control signal to the initial lower duty cycle.

In any of the disclosed embodiments, causing the PWM control signal with the first PWM duty cycle to be provided to the input of the first fan, receiving the tachometer signal output by the first fan, comparing the frequency of the tachometer signal output by the first fan to the expected tachometer frequency, determining whether or not the first fan is a fan of the first fan type, and providing the indication of whether or not the first fan is a fan of the first fan type to a fan controller may be performed in response to an initiation of a power-on-self-test or a change in a hardware configuration of the information handling system.

In yet another aspect, a disclosed article of manufacture includes a non-transitory, computer-readable memory medium including instructions that, when executed by at least one processor of an information handling system, cause the information handling system to provide a pulse width modulation (PWM) control signal with a first PWM duty cycle to an input of a given fan, the first PWM duty cycle being greater than or equal to a predetermined threshold duty cycle, receive a tachometer signal output by the given fan while the PWM control signal has the first PWM duty cycle, the tachometer signal including a pair of pulses for each rotation of the given fan such that the frequency of the tachometer signal expressed in terms of revolutions per minute (RPM) is proportional to the speed of the given fan, compare the frequency of the tachometer signal output by the given fan while the PWM control signal has the first PWM duty cycle to an expected tachometer frequency for fans of a first fan type when receiving a PWM control signal of the first PWM duty cycle, determine, based on the comparison, whether or not the given fan is a fan of the first fan type, and provide an indication of whether or not the given fan is a fan of the first fan type to a fan controller.

In any of the disclosed embodiments, when executed by the at least one processor, the instructions may further cause the information handling system to, responsive to determining, based on the comparison, that the given fan is not a fan of the first fan type, compare the frequency of the tachometer signal output by the given fan while the PWM control signal has the first PWM duty cycle to an expected tachometer frequency for fans of a second fan type when receiving a PWM control signal of the first PWM duty cycle, and responsive to determining, based on the comparison, that the given fan is a fan of the second fan type, provide an indication that the given fan is a fan of the second fan type to the fan controller.

In any of the disclosed embodiments, when executed by the at least one processor, the instructions may further cause the information handling system to calculate a first average frequency of the tachometer signal output by the given fan during a first time period in which the PWM control signal has the first PWM duty cycle, generate a first data structure representing a histogram including multiple bins, wherein each bin represents a respective range of tachometer frequency values for the tachometer signal output by the given fan during the first time period and each bin is associated with a respective count value indicating the number of occurrences of a tachometer frequency value for the tachometer signal falling within the respective range of tachometer frequency values represented by the bin during the first time period, determine a predetermined number of top bins associated with the highest respective count values in the first data structure, and save reference data representing one or more of the calculated average frequency, identifiers of the top bins in the first data structure, and the respective count values associated with the top bins.

In any of the disclosed embodiments, when executed by the at least one processor, the instructions may further cause the information handling system to calculate a second average frequency of the tachometer signal output by the given fan during a second time period in which the PWM control signal has the first PWM duty cycle, generate a second data structure representing a histogram including multiple bins, wherein each bin represents a respective range of tachometer frequency values for the tachometer signal output by the given fan during the second time period and each bin is associated with a respective count value indicating the number of occurrences of a tachometer frequency value for the tachometer signal falling within the respective range of tachometer frequency values represented by the bin during the second time period, determine a predetermined number of top bins associated with the highest respective count values in the second data structure, compare data representing one or more of the calculated second average frequency, identifiers of the top bins in the second data structure, and the respective count values associated with the top bins in the second data structure to the saved reference data, and responsive to detecting a discrepancy between the data representing the calculated second average frequency, identifiers of the top bins in the second data structure, or the respective count values associated with the top bins in the second data structure and the saved reference data, provide an indication of an anomaly associated with the given fan to the fan controller.

BRIEF DESCRIPTION OF THE DRAWINGS

For a more complete understanding of the present invention and its features and advantages, reference is now made to the following description, taken in conjunction with the accompanying drawings, in which:

FIG. 2 is a flow diagram illustrating selected elements of an embodiment of a method for fan typing;

DESCRIPTION OF PARTICULAR EMBODIMENT(S)

Figure 1:
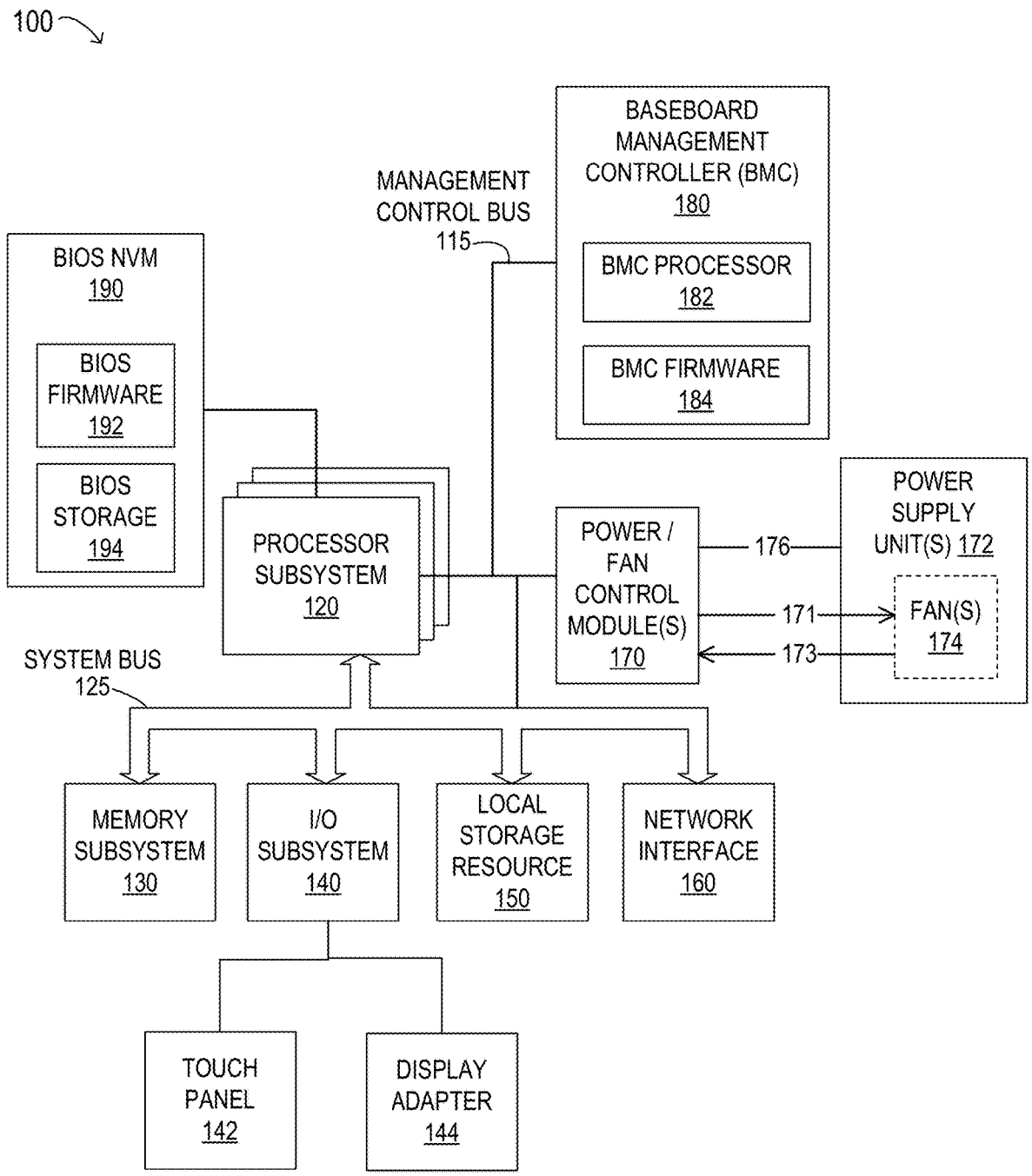
FIG. 1 is a block diagram illustrating selected elements of an embodiment of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, widget "72-1" refers to an instance of a widget class, which may be referred to collectively as widgets "72" and any one of which may be referred to generically as a widget "72".

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, in various embodiments, an information handling system may be a personal computer, a PDA, a consumer electronic device, a network storage device, or another suitable device and may vary in size, shape, performance, functionality, and price. In other embodiments, an information handling system may be one of multiple computing devices in a large server system. An information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), or flash memory (SSD); as well as communications media such as wires, optical fibers, microwaves, radio waves, and other electromagnetic or optical carriers; or any combination of the foregoing.

As will be described in further detail, the inventors of the present disclosure have developed systems and methods disclosed herein for fan typing and anomaly detection for fans included in, or coupled to, information handling systems. In at least some embodiments, the disclosed techniques are not dependent on dedicated fan typing circuitry or wiring and can distinguish between many different types of fans with different electrical specifications. The disclosed techniques may also be used for anomaly detection, such as when a fan is missing, has failed, or is experiencing a temporary, permanent, or frequency-specific performance degradation.

Particular embodiments are best understood by reference to FIGS. 1-8, in which like numbers are used to indicate like and corresponding parts.

Turning now to the drawings, FIG. 1 illustrates a block diagram depicting selected elements of an embodiment of information handling system 100. It is noted that FIG. 1 is not drawn to scale but is a schematic illustration. As described herein, in at least some embodiments, information handling system 100 may represent a personal computing device, such as a personal computer system, a desktop computer, a laptop computer, a notebook computer, etc., operated by a user. In various embodiments, information handling system 100 may be operated by the user using a keyboard and a mouse (not shown).

As shown in FIG. 1, components of information handling system 100 may include, but are not limited to, a processor subsystem 120, which may comprise one or more processors, and system bus 125 that communicatively couples various system components to processor subsystem 120 including, for example, a memory subsystem 130, an I/O subsystem 140, local storage resource 150, and a network interface 160. System bus 125 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HYPERTRANSPORT™ (HT) bus, and VIDEO ELECTRONICS STANDARDS ASSOCIATION™ (VESA) local bus.

In FIG. 1, network interface 160 may be a suitable system, apparatus, or device operable to serve as an interface between information handling system 100 and a network. More specifically, network interface 160 may enable information handling system 100 to communicate over a network (not shown) using a suitable transmission protocol or standard. The network may include, or be part of, a storage area network (SAN), a personal area network (PAN), a local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). In some embodiments, network interface 160 may be communicatively coupled via a network to a network storage resource (not shown). The network coupled to network interface 160 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. The network coupled to network interface 160 or various components associated therewith may be implemented using hardware, software, or any combination thereof.

As depicted in FIG. 1, processor subsystem 120 may comprise a system, device, or apparatus operable to interpret and/or execute program instructions and process data, and may include a microprocessor, microcontroller, digital signal processor (DSP), application specific integrated circuit (ASIC), or another digital or analog circuitry configured to interpret and execute program instructions and process data. In some embodiments, processor subsystem 120 may interpret and execute program instructions and process data stored locally (e.g., in memory subsystem 130 or local storage resource 150). In the same or alternative embodiments, processor subsystem 120 may interpret and execute program instructions and process data stored remotely (e.g., in network storage resources accessed via network interface 160).

In some embodiments, a memory subsystem within processor subsystem 120 may include multiple data caches, such as one or more level 1 (L1) caches and/or level 2 (L2) caches (not shown). For example, a level 1 cache may be local to a particular processor or processor core within processor subsystem 120, and a level 2 cache may be shared between multiple processors or processor cores within a processor subsystem 120. A cache controller within a memory subsystem of processor subsystem 120 may include circuitry to manage the contents of one or more L1 caches and/or L2 caches.

Also in FIG. 1, memory subsystem 130 may comprise a system, device, or apparatus operable to retain and retrieve program instructions and data for a period of time (e.g., computer-readable media). Memory subsystem 130 may comprise random access memory (RAM), electrically erasable programmable read-only memory (EEPROM), a PCM-CIA card, flash memory, magnetic storage, opto-magnetic storage, or a suitable selection or array of volatile or non-volatile memory that retains data after power is removed. In some embodiments, memory subsystem 130 may include a level 3 (L3) cache or a last-level cache (not shown), which may be shared between processors or processor cores in multiple processor subsystems 120. Local storage resource 150 may comprise computer-readable media (e.g., hard disk drive, floppy disk drive, CD-ROM, and/or other type of rotating storage media, flash memory, EEPROM, or another type of solid state storage media) and may be generally operable to store instructions and data, and to permit access to stored instructions and data on demand. In at least some embodiments, local storage resource 150 may include a collection or array of storage devices and a storage controller.

Also shown in FIG. 1 is non-volatile BIOS memory (BIOS NVM) 190, often simply or collectively referred to as the 'BIOS'. In some embodiments, BIOS NVM memory 190 may be implemented using non-volatile random access memory. As shown, BIOS NVM 190 may include BIOS firmware 192, representing pre-boot instructions executable by processor subsystem 120, for example, for preparing information handling system 100 to boot by activating various hardware components in preparation of launching an operating system for execution. BIOS firmware 192, which may implement the Basic Input/Output System (BIOS) firmware interface, may further include instructions for displaying a user interface (which may also referred to as a BIOS setup program) by which a user may access, modify, and store BIOS user settings. Also shown stored in BIOS NVM 190 is BIOS storage 194, which may represent data, such as program code, settings, data values, etc. that BIOS firmware 192 may store. In some embodiments, BIOS firmware 192 may implement a power-on-self-test when information handling system 100 is powered up or restarted following a shutdown. In certain embodiments, BIOS firmware 192 may have access to network interface 160 for various types of communication, such as with a network administrator. In certain embodiments, at least a portion of BIOS storage 194 may physically reside on a remote storage resource, such as in a network storage resource (not shown). In some embodiments, an interface in compliance with the Unified Extensible Firmware Interface (UEFI) specification may replace the Basic Input/Output System (BIOS) firmware interface in the example embodiment illustrated in FIG. 1. The UEFI specification defines a software interface between an operating system and platform firmware.

In information handling system 100, I/O subsystem 140 may comprise a system, device, or apparatus generally operable to receive and transmit data to or from or within information handling system 100. I/O subsystem 140 may represent, for example, a variety of communication interfaces, graphics interfaces, video interfaces, user input interfaces, and peripheral interfaces. In some embodiments, I/O subsystem 140 may comprise a touch panel 142 and a display adapter 144. The touch panel 142 may include circuitry for enabling touch functionality in conjunction with a display device that is driven by the display adapter 144.

In the illustrated embodiment, information handling system 100 also includes a baseboard management controller (BMC) 180. Baseboard management controller 180 includes a BMC processor 182 and BMC firmware 184 that when executed by BMC processor 182 performs the operations of the baseboard management controllers described herein. In at least some embodiments, baseboard management controller 180 may monitor the physical state of information handling system 100 as well as devices included within or coupled to information handling system 100. In some embodiments, baseboard management controller 180 may be configured to perform remote management operations. In some embodiments, baseboard management controller 180 may be configured to provide automatic alerts, to initiate power-on or power cycle events, boot or reboot events, or other power control functions on behalf of information handling system 100. In some embodiments, baseboard management controller 180 may be configured to perform operations described herein for fan typing and anomaly detection.

In the illustrated embodiment, information handing system 100 includes one or more power/fan control modules 170 and one or more power supply units 172, each of which may include one or more fans 174. In at least some embodiments, power/fan control modules 170 may control the allocation of power generated by one or more of the power supply units 172 to other resources in system 100. In some embodiments, one or more of the power/fan control modules 170 may include a management controller (MC). The management controller may include circuitry and/or logic to perform operations described herein for fan typing and anomaly detection. In other embodiments, one or more fans 174 may reside outside of the power supply units 172, in which case the functionality of power/fan control modules 170 may be divided into separate power control modules and fan control modules (not shown). In some embodiments, baseboard management controller 180 may be implemented within one or more of the power/fan control modules 170 rather than as a separate component of information handling system 100. In some embodiments, baseboard management controller 180 may exchange information and/or control signals with other components of information handling system 100, such as power/fan control modules 170, power supply units 172, and/or fans 174 over a management control bus 115. In some embodiments, baseboard management controller 180 may provide controls to and receive information from various power supply units 172 and/or fans 174 through one or more power/fan control modules 170. For example, baseboard management controller 180 may, either directly or through one of the power/fan control modules 170, provide a PWM control signal 171 as an input to a fan 174 and may receive a tachometer signal 173 that is output from the fan 174. Baseboard management controller 180 may, either directly or through one of the power/fan control modules 170, exchange information and/or control signals with other elements of power supply units 172, such as to provide a notification of a result of a fan typing or fan anomaly detection exercise or to control the distribution of power in the information handling system or perform other functions, via one or more analog or digital signals 176.

As noted above, fan typing is typically provided using dedicated motherboard circuitry, fan assembly circuitry, and wire harness wiring. The fan assembly circuitry typically includes extra pins on the motherboard and on the fan connector, as well as a wire harness connection of a "type" pin between +12V, GND or float. The motherboard circuitry typically includes logic that is able to multiplex in voltage signals from particular fan slots, scale down the voltages, and perform analog to digital conversions to determine the fan type. This dedicated circuitry and wiring can typically only grossly determine the fan type. For example, the circuitry might only be able to determine whether or not a fan is present in a particular fan slot or whether an installed fan is a high performance fan or a standard fan with no additional specificity.

The systems and methods described herein may include optimizations to standard fan to motherboard interfaces such as replacing hardware based fan type detection (using dedicated circuits, firmware, and connectors that increase costs related to board space, fan assembly costs and circuitry complexity) with software based fan typing. This approach may not only decrease system costs but may also increase the quality (e.g., the accuracy) of the fan typing solution. In some embodiments, the disclosed systems may include preloaded electrical specifications, e.g., data stored in a fan controller or in baseboard management controller tables representing curves in which tachometer signals output by fans of a particular fan type are plotted versus different PWM control signal duty cycles. Tachometer signal readings obtained from a given fan during a system boot phase or during runtime may be compared to the stored curve data to determine the fan type.

The fans installed in information handling systems work as hard as they can to produce an expected tachometer signal output (in terms of revolutions per minute, or RPM) based on the input PWM duty cycle. Various fan failure modes, such as broken blades or the presence of debris (e.g., dust or dirt) can affect the ability of a fan to perform with uniform air flow as expected by thermal control algorithms, especially in cases in which in-line dual rotors are not performing as expected. As the bell bearings or other components of the wear down, the ability of the fan to maintain the expected tachometer signal output corresponding to the duty cycle of its PDM control signal input is negatively impacted. Using existing fan typing techniques, it can be difficult to distinguish between a fan of one fan type that has suffered this type of degradation and a fan of a different type with different electrical specifications, leading to incorrect fan typing.

A typical fan will spin evenly when it is in proper working condition. However, when a fan blade is broken or has some debris on it, this may introduce some wobble. In some embodiments of the systems and methods described herein, that wobble may be detected based on inconsistencies in the captured tachometer signal readings. As described in more detail below, a baseboard management controller may be operable to capture and plot histograms to detect jitter on the tachometer signal output by a fan and to infer fan wobble based on detecting the tachometer signal jitter. In at least some embodiments of the present disclosure, management controller firmware may be operable to detect fan wobble for the purposes of better fan typing confidence, for predicating failure events, and/or for inferring vibrational harmonics beyond the pure RPM level, which may then be used to extrapolate the effect of a rotor on other system elements (e.g., a spinning rotor hard disk drive).

In FIG. 2, selected elements of an embodiment of a method 200 for fan typing in an information handling system, as described herein, are depicted in flow diagram form. Method 200 may be performed using information handling system 100 (see FIG. 1). For example, certain operations may be performed by a baseboard management controller, such as BMC 180 illustrated in FIG. 1. It is noted that certain operations described in method 200 may be optional or may be rearranged in different embodiments. Method 200 may begin, at 202, by supplying a PWM control signal with a given duty cycle to an input of a fan. The given duty cycle may be greater than or equal to a predetermined threshold duty cycle above which confidence that the potential fan types for the fan can be distinguished from each other is high.

At 204, method 200 may include receiving a tachometer signal output of the fan while the PWM control signal has the given PWM duty cycle. The tachometer signal output may be received as data representing a frequency value for the tachometer that is proportional to the fan speed in terms of revaluations per minute (RPM).

At 206, the method may include comparing frequency indicated by the tachometer signal output of the fan to an expected frequency for fans of a given fan type when controlled with the given PWM duty cycle. In some embodiments, this may include looking up the expected value of the frequency for fans of the given fan type when controlled with the given PWM duty cycle in a table maintained by the BMC that stores data representing RPM vs. PWM curves for fans of one or more fan types. In some embodiments, the given fan type may be an expected fan type for the given fan, according to system configuration information associated with the information handling system. For example, the information handling system may include (e.g., in BIOS NVM 190 illustrated in FIG. 1 or in another non-volatile memory location accessible by the BMC) an identifier associated with the particular hardware configuration of the information handling system. The BMC may obtain the configuration identifier from the memory and may determine the expected fan type based on the obtained configuration identifier.

At 208, method 200 may include determining, based on the comparison, whether or not the fan is a fan of the given fan type. For example, if the frequency indicated by the tachometer signal output of the fan is equal to, or not statistically different from, an expected frequency for fans of a given fan type when controlled with the given PWM duty cycle, the given fan may be determined to be a fan of the given fan type. However, if the frequency indicated by the tachometer signal output of the fan is statistically different from the expected frequency for fans of a given fan type when controlled with the given PWM duty cycle, this may indicate that the fan is not a fan of the given type or that the fan cannot be typed due to a failure or significant performance degradation.

At 210, the method may include providing an indication of whether or not the fan is a fan of the given fan type to a fan controller. In one example, if it is determined that the fan is a fan of the given fan type, an indication that the fan is of the given type may be provided to power/fan control module 170 (e.g., via management control bus 115). In another example, providing the indication that the fan is of the given type may including writing data indicating the result of the fan typing operation to a system log or control table stored in a memory accessible by the power/fan control module 170 or stored in BMC 180, for example.

Figure 3:
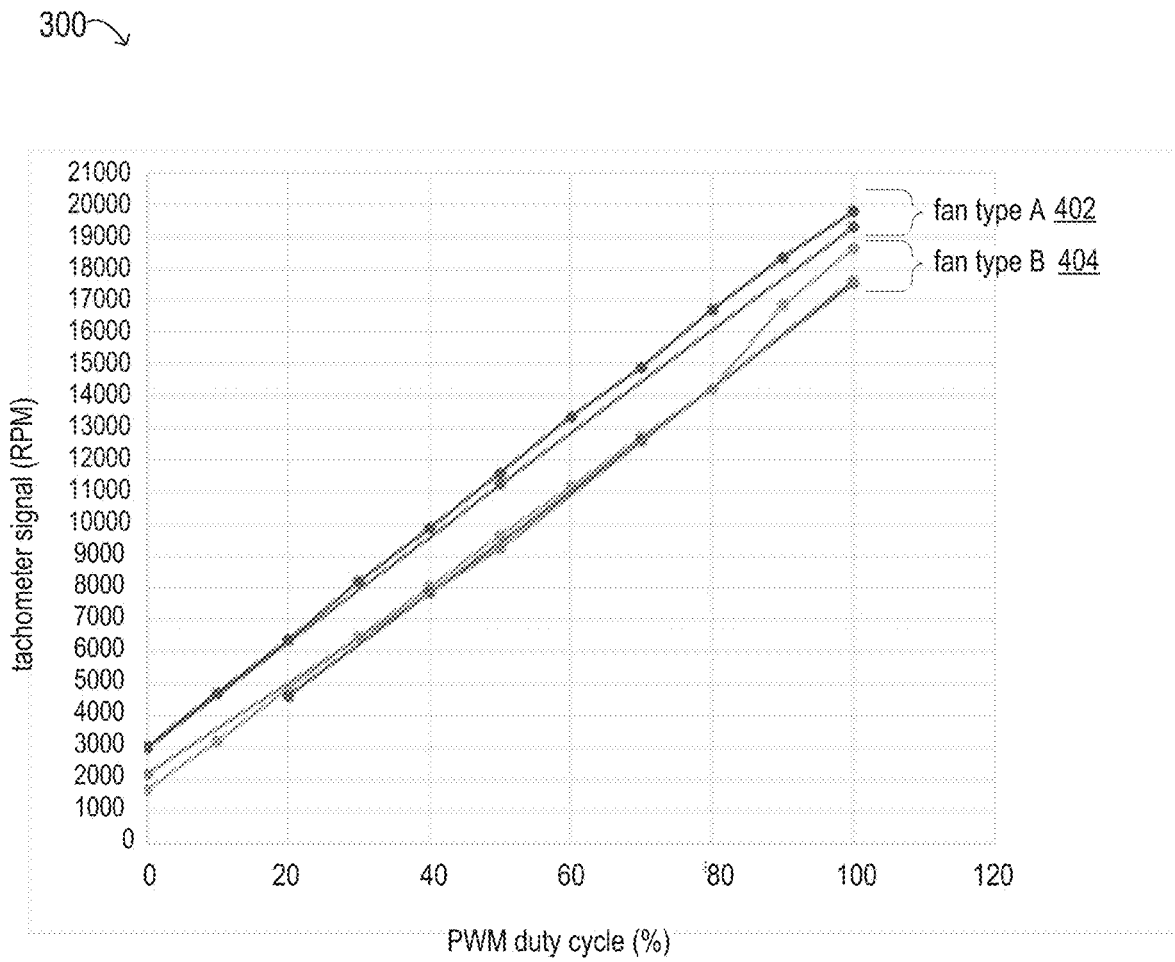
FIG. 3 is a graphical representation of several example duty cycle curves for fans of two different fan types.

FIG. 3 is a graphical representation 300 of several example duty cycle curves for fans of two different fan types referred to as fan type A and fan type B. More specifically, graph 300 includes five curves, each plotting tachometer signal values (in terms of RPM) versus PWM duty cycle values (in terms of percentages) for a particular 2U fan supplied by a particular vendor. In this example, fan type A is one of several high performance 2U fan types and fan type B is one of several standard 2U fan types. In FIG. 3, graph 300 includes respective curves for two fans of fan type A supplied by two different vendors (shown as curves 402) and for three fans of fan type B supplied by three different vendors (shown as curves 404). In this example, there is roughly a 2000 RPM difference between the curves for the type A fans and the type B fans at the vast majority of PWM duty cycle points. This example illustrates that even when the fans operate at relatively low fan speeds (e.g., during a system boot phase), data obtained from the tachometer signals may be sufficient to be able to distinguish between these two types of fans, based on the expected RPM of fans of each type at particular PWM duty cycle points.

Figure 4:
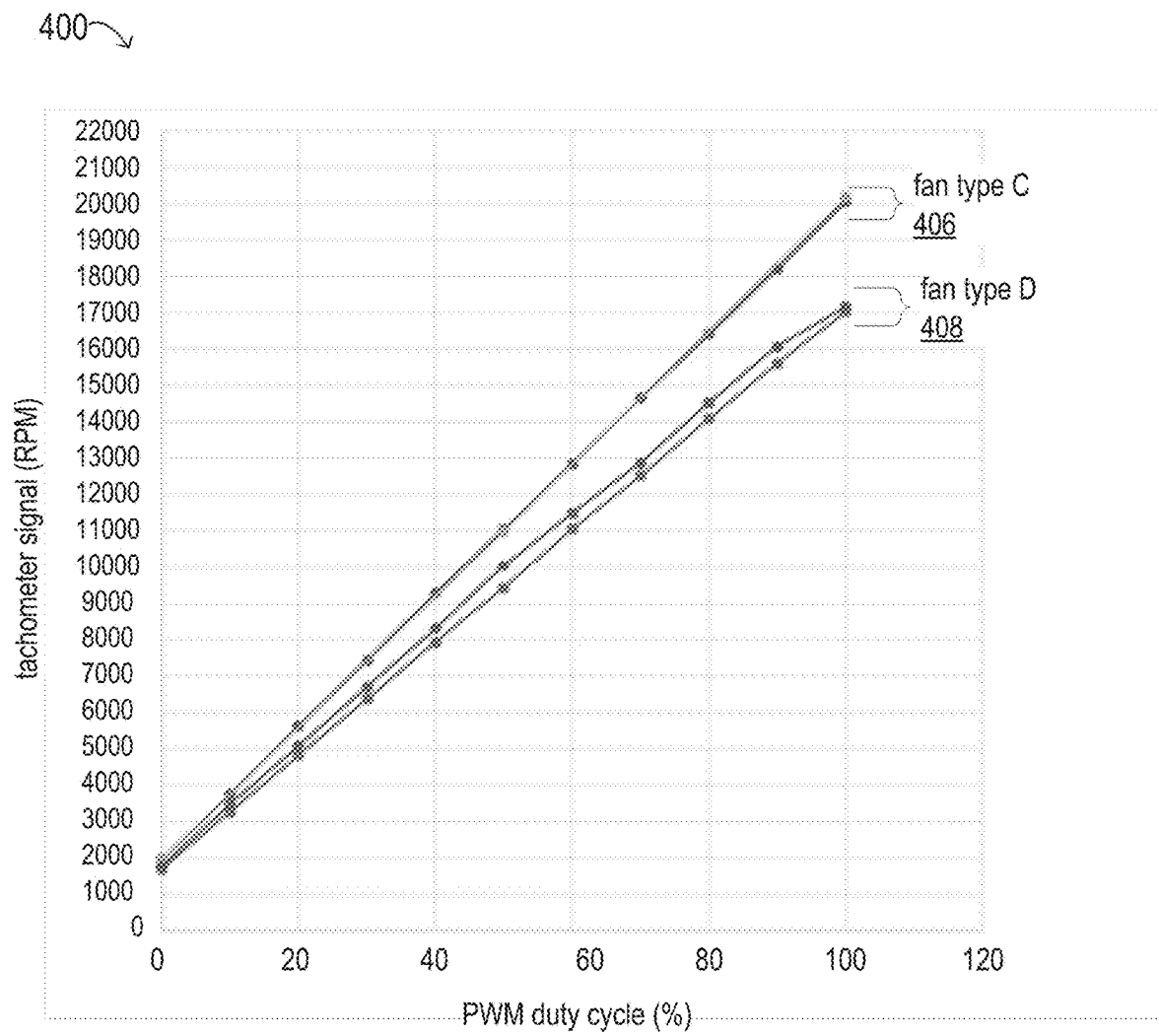
FIG. 4 is a graphical representation of several example duty cycle curves for fans of two additional fan types.

FIG. 4 is a graphical representation 400 of several example duty cycle curves for fans of two additional fan types referred to as fan type C and fan type D. More specifically, graph 400 includes four curves, each plotting tachometer signal values (in terms of RPM) versus PWM duty cycle percentages for one of the two rotors in a particular 1U fan supplied by a particular vendor. In this example, fan type C is one of several high performance 1U fan types and fan type D is one of several standard 1U fan types. In FIG. 4, graph 400 includes respective curves for two fans of a fan type C supplied by two different vendors (shown as curves 406) and for two fans of a fan type D supplied by two different vendors (shown as curves 408). In this example, the tachometer signals from the type C fans and the type D fans are similar at very low PWM duty cycle points and deviate at higher PWM duty cycle points. In this example, a PWM duty cycle of 40% may be sufficient to determine, with high confidence, whether a type C fan or a type D fan is installed. For example, FIG. 4 illustrates that there is a roughly 1000 RPM difference (e.g., 8000 vs. 9000) between the curves for type C fans and type D fans when the duty cycle is 40%. This example illustrates that, even for fans of two fan types that produce a similar tachometer signal at relatively low fan speeds, data obtained from the tachometer signals may be sufficient to be able to distinguish between these two types of fans, based on the expected RPM of fans of each type at higher PWM duty cycle points. Note that in both graph 300 illustrated in FIG. 3 and in graph 400 illustrated in FIG. 4, the curves for fans of the same type supplied by different vendors deviated by a small amount, in some cases, but they remained within the allowed tolerances of the electrical specifications for these fans.

Note that while the graphs shown in FIGS. 3 and 4 illustrate differences in the curves for two different types of fans, the techniques described herein may be used to distinguish between more than two types of fans. In some systems, configurations including a mix of fan types, including both standard and high performance fan types, are not supported. However, in some embodiments, the techniques described herein for fan typing may be used to perform fan typing in systems that include fans of multiple different fan types. For example, these techniques may be used to determine a fan type from among multiple low cost fans, multiple mid-range or standard fans, and/or multiple high performance fans from one or multiple vendors, in different embodiments. In some embodiments, a predetermined threshold duty cycle above which confidence that the potential fan types for the fan can be distinguished from each other is high may be calculated based on historical data, such as that shown in FIGS. 3 and 4. The threshold duty cycle may be programmable, and therefore adaptable to changes in fan technology, system configurations, system workloads, performance goals, environmental factors, or other parameters that affect the expected relationships between PWM control signal duty cycles and tachometer signals. In some system configurations, optional slots, in which there might or might not be a fan installed at any particular time, are not supported. However, in some embodiments, the techniques described herein for fan typing may be able to detect whether there is a fan missing in an optional fan slot.

In some embodiments, the systems described herein may initiate a characterization training cycle during which to discern the fan type based on an applicable PWM control signal stimulus to tachometer response curve. In some embodiments, a training cycle may be initiated automatically upon a BMC boot or a thermal control daemon start. In some embodiments, a training cycle may be initiated automatically upon detection of a fan hot plug event via a transition from receiving no tachometer pulses to receiving any tachometer pulses while the host system is powered on (e.g., via an interrupt triggered by the first received tachometer edge). Once the training cycle is initiated, the BMC may perform fan typing, as described above, for each fan in the information handling system in sequence. This may include the BMC firmware causing the PWM control signal duty cycle for each fan slot, in sequence, to ramp up to the predetermined threshold duty cycle, if it is not already operating at that duty cycle point, observing the tachometer response, including collecting data representing the response, and then returning to the previous PWM duty cycle. Performing the fan typing based on tachometer reading captured at the predetermined threshold duty cycle point, either at the time of data collection or later, may allow for high confidence in the result, as the curves diverge, while the fan speed is not high enough to create user concern or be excessively noisy.

Once the fan types of all fans in the system have been determined, the results may be compared to the expected system configuration. For example, if system configuration information indicates that the system should include four fans in particular slots and that high performance fans are required, a comparison between the determined fan types and this expected configuration may be made to see if the required high performance fans are present in the expected fan slots. Note that some users may purchase high performance fans even if the system configuration does not require it. In this case, the techniques described herein may be used to accurately account for inventory usage. In some embodiments, a failed fan (for which the tachometer signal output indicates that the fan speed is below a minimum speed or is below the expectation for a standard fan) may be flagged as failed and may not be positively typed.

Figure 5:
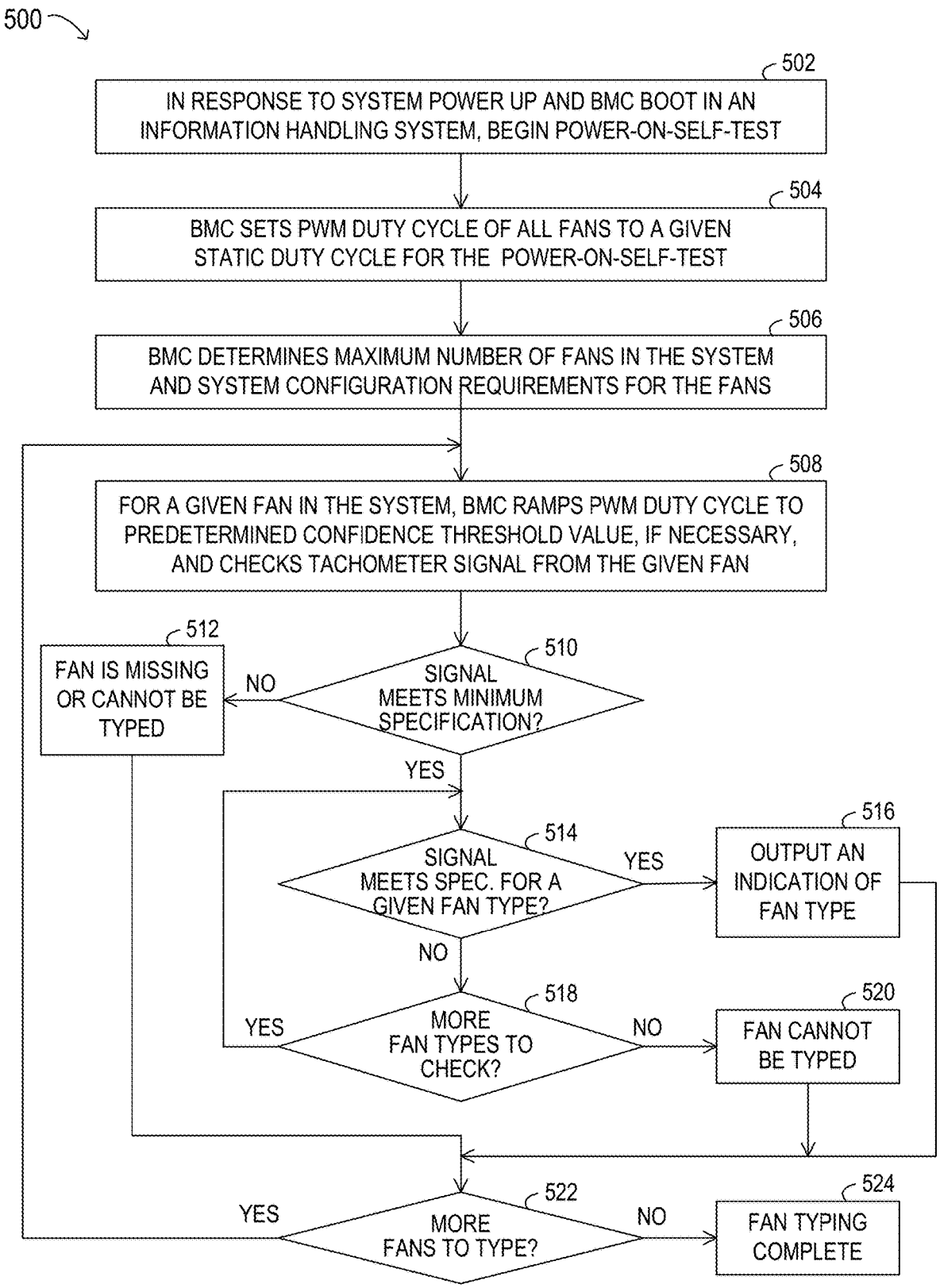
FIG. 5 is a flow diagram illustrating selected elements of an embodiment of a method for a management controller to perform fan typing in an information handling system.

In FIG. 5, selected elements of an embodiment of a method 500 for a management controller to perform fan typing in an information handling system, as described herein, are depicted in flow diagram form. Method 500 may be performed using information handling system 100 (see FIG. 1). For example, certain operations may be performed by a baseboard management controller, such as BMC 180 illustrated in FIG. 1. It is noted that certain operations described in method 500 may be optional or may be rearranged in different embodiments. Method 500 may begin at 502 when, in response to system power up and BMC boot in an information handling system, the information handling system begins performing a power-on-self-test. In some embodiments, the power-on-self-test may be performed by the execution of a portion of BIOS firmware (such as BIOS firmware 192 illustrated in FIG. 1).

At 504, method 500 may include the BMC setting the PWM duty cycle of all fans in the information handling system to a given static duty cycle for the power-on-self-test. Since fan noise increases with fan rotation speed, the given static duty cycle may represent a predetermined default duty cycle for power-on-self-test that has been selected to produce less noise than when the fan is operating in normally and/or for low power operation of the fan. In one example, the given static duty cycle for the power-on-self-test may be less than or equal to 20%.

At 506, the method may include the BMC determining the maximum number of fans in the system and the system configuration requirements for the fans in this system. In some embodiments, this configuration information may be obtained from a local memory, such as BIOS NVM 190 or another local memory, and may include an indication of the total number of fan slots in the system, an indication of the number of fan slots that are, or that are expected to be, populated in the current configuration of the information handling system, and/or an indication of the performance requirements for each of the fans that are, or are expected to be, present in the information handling system. In one example, one or more fans may be expected to be high performance fans. In another example, one or more fans may be expected to be low cost fans. In some embodiments, all of the fans may have the same performance requirements. In other embodiments, different fans in the information handling system may have different performance requirement, e.g., depending on their location and/or function within the information handling system.

At 508, method 500 may include, for a given fan in the system, the BMC ramping the PWM duty cycle up from the given static duty cycle for the power-on-self-test to a predetermined confidence threshold value, if necessary, and checking the tachometer signal from the given fan. For example, if the given fan is already operating at or above the predetermined confidence threshold value (e.g., if the static duty cycle for the power-on-self-test for a particular fan is greater than or equal to the predetermined confidence threshold value), there may be no need to ramp up the PWM duty cycle for perform fan typing. The predetermined confidence threshold duty cycle may be a duty cycle that has been statistically shown to represent a duty cycle above which confidence that the potential fan types for the fans in the information handling system can be distinguished from each other is high. In one example embodiment, the predetermined threshold duty cycle may be 40%. In other embodiments, the predetermined threshold duty cycle may be higher or lower than 40%.

If, at 510, it is determined that the tachometer signal meets a minimum specification for all fan types, method 500 may continue to 514. Otherwise, the tachometer signal may indicate that the fan expected to be present in a given fan slot may be missing entirely or may be damaged or degraded to a point at which cannot be typed, as in 512.

If at 514, it is determined that the tachometer signal meets the specification for a given fan type, method 500 proceeds to 516. Otherwise, the method may continue to 518. At 516, output an indication of fan type and the attempt to type the given fan is concluded. In some embodiments, once the fan type has been determined for the given fan, an indication of the fan type may be provided to power/fan control module 170 (e.g., via management control bus 115). In another example, once the fan type has been determined for the given fan, data indicating the result of the fan typing operation may be written to a system log or control table stored in a memory accessible by the power/fan control module 170 or stored in BMC 180, for example.

If, at 518, there are more fan types to check, method 500 may return to 514, after which the operation shown at 514 may be repeated one or more times to determine if the given fan is a fan of another one of multiple fan types that are possible for fans in the particular slot in the information handling system. If, or once, there are no additional fan types under consideration, the given fan cannot be typed and the attempt to type the given fan is concluded, as in 520. In some embodiments, once it is determined that the given fan cannot be typed, an indication of the failure of the fan typing attempt may be provided to power/fan control module 170 (e.g., via management control bus 115) for subsequent analysis. In another example, once it is determined that the given fan cannot be typed, data indicating the failure of the fan typing attempt may be written to a system log or control table stored in a memory accessible by the power/fan control module 170 or stored in BMC 180, for example.

Once the attempt to type the given fan is concluded, regardless of whether or not it was successful, method 500 may continue at 522. If, at 522, there are more fans in the system to be typed, the method may return to 508, after which the operations shown in 508 through 520 may be repeated, as appropriate for each additional fan in the system. If, or once, there are no additional fans to be typed, the fan typing operation may be complete, as in 524.

In some cases, it may be useful to detect overspinning or irregular spinning in a fan as an indication of a false positive for the presence of a higher performance fan presence. In some cases, it may be useful to predict fan failures and/or detect actual fan failures that are not reflected in absolute tachometer RPMs that are within specification limits. Such cases can occur if, for example, a fan blade is broken, a fan blade has debris on it, or some ball bearings of a fan are sticking. In some embodiments of the present disclosure, in addition to interpreting a higher than expected tachometer reading as indicating the presence of a high performance fan, a higher than expected tachometer reading may indicate the presence of a broken blade or a blade with debris on it, which may cause the fan to wobble and result in non-uniform tachometer ticks per revolution. In some embodiments, such asymmetric wobble may be detectable by a software function in the BMC firmware that measures tachometer tick cycle to cycle jitter and plots the measurement in a histogram. The crossing of a statistical threshold of tachometer cycle to cycle jitter may trigger a predictive failure sensor or may be used to inform a further refinement of physical fan type installed.

In some embodiments, this statistical jitter method for detecting wobble and asymmetric spinning may be used to infer localized, slot-specific fan vibrations outside of the expected tachometer signal harmonics. This information may be useful in a thermal control algorithm for the purpose of intelligently "steering" fan speeds away from sensitive vibration points that may adversely affect entities within the vicinity of that fan motor, such as rotating hard drives. This may help maximize spinning rotor drive throughput by reducing the access error rate.

For example, a hard drive might be sensitive to certain frequency variations. In some embodiments, once the problem frequencies are identified, firmware may be operable to avoid those frequencies. For example, the BMC firmware may avoid supplying a PWM control signal to the fan having a duty cycle associated with tachometer signal values corresponding to the problem frequencies. In some embodiments, when an anomaly, such as a fan failure, performance degradation, predicted failure, cycle to cycle jitter, inferred wobble, or frequency sensitivity is identified, a notification (e.g., a flag or warning) may be provided indicating that further investigation may be needed or that a fan may need to be replaced, among other potential corrective actions.

Figure 6:
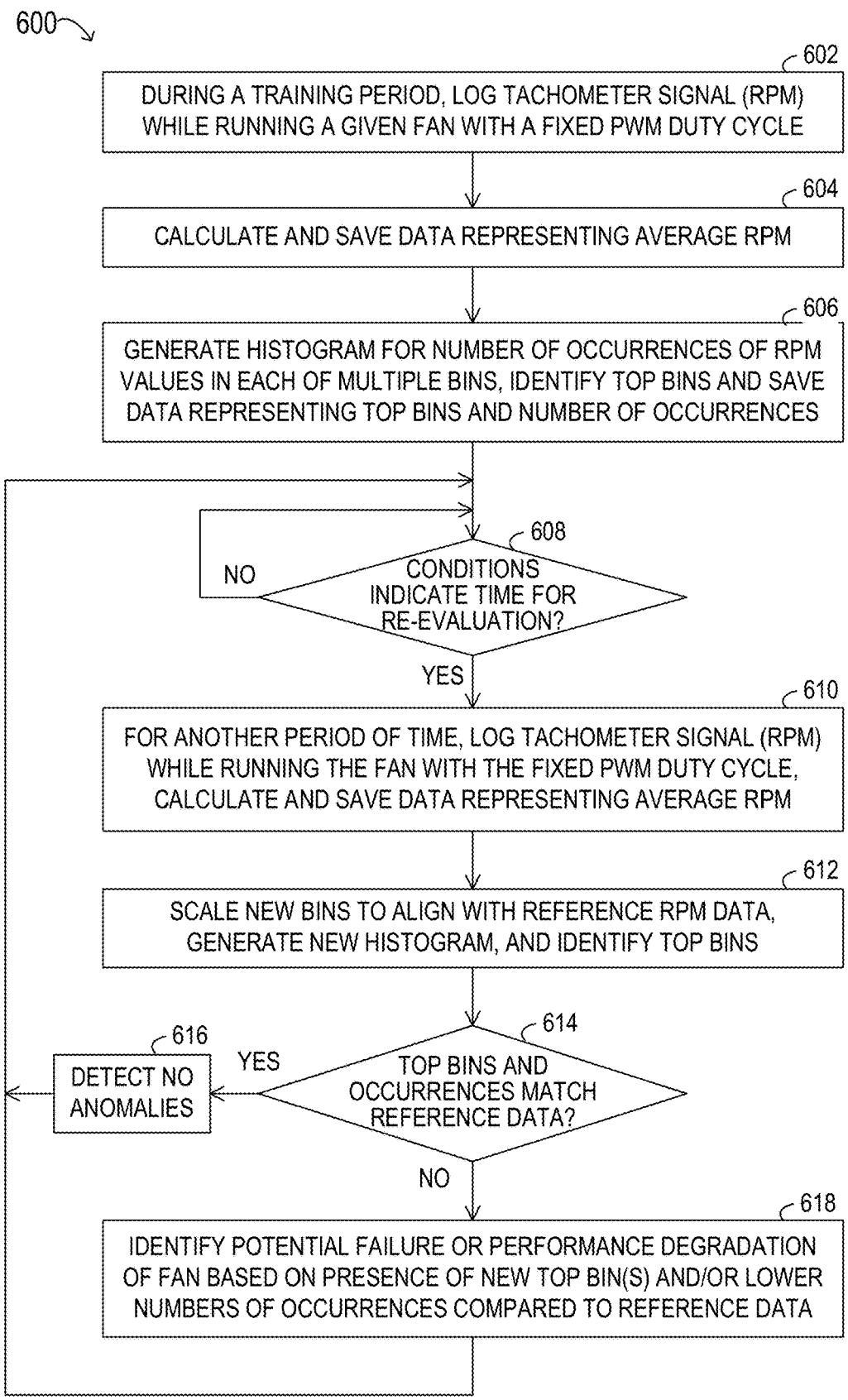
FIG. 6 is a flow diagram illustrating selected elements of an embodiment of a method for anomaly detection for a fan based on changes in a tachometer signal received from the fan.

In FIG. 6, selected elements of an embodiment of a method 600 for anomaly detection for a fan based on changes in a tachometer signal received from the fan, as described herein, are depicted in flow diagram form. In some embodiments, method 600 may be performed using information handling system 100 (see FIG. 1). In some embodiments, certain operations may be performed by a baseboard management controller, such as by executing a portion of BMC firmware 184 on BMC processor 182 of BMC 180 illustrated in FIG. 1. In some embodiments, certain operations may be performed by executing, on processor subsystem 120, program instructions stored locally (e.g., in memory subsystem 130, or local storage resource 150) or remotely (e.g., in a network storage resource accessible through network interface 160). In some embodiments, certain operations may be performed by a computing device that is separate from the information handling system whose fans are being characterized, e.g., as an off-line analysis of data collected during operation of the information handling system. It is noted that certain operations described in method 600 may be optional or may be rearranged in different embodiments. Method 600 may begin at 602 when, during a training period, the information handling system begins logging a tachometer signal (in terms of RPM) while running a given fan with a fixed PWM duty cycle input. In some embodiments, the fixed PWM duty cycle may represent a predetermined confidence threshold value, as described above.

At 604, method 600 may include calculating and saving data representing an average RPM reading collected during the training period. In various embodiments, the data representing the average RPM reading collected during the training period may be stored locally (e.g., in memory subsystem 130, or local storage resource 150) or remotely (e.g., in a network storage resource accessible through network interface 160).

At 606, the method may include generating a histogram representing the number of occurrences of RPM values in each of multiple bins of RPM values, identifying the top bins represented in the histogram, and saving the data representing the top bins and the number of occurrences of RPM values in each of the top bins or in each of the multiple bins. In various embodiments, the data representing the top bins and the number of occurrences of RPM values in each of the top bins or in each of the multiple bins collected during the training period may be stored locally (e.g., in memory subsystem 130, or local storage resource 150) or remotely (e.g., in a network storage resource accessible through network interface 160). In one example, a histogram tool of a spreadsheet application may be operable to count the number of data points in each data bin. A data point may be included in a particular data bin if its value is greater than the lower bound for the data bin and is less than or equal to the upper bound for the data bin. If the data range for the bins is not specified, the spreadsheet tool may create a set of evenly distributed bins between the minimum and maximum values of the input data.

If and when, at 608, conditions indicate that it is time for a re-evaluation of the fans in the information handling system, the method may continue at 610. For example, a re-evaluation may be performed periodically (e.g., on a predetermined schedule) or may be initiated in response to a configuration change in the information handling system, such as the addition of a fan or another component in the information handling system (using a hot plug installation or an installation while at least some parts of the system are shut down), the replacement of a fan or another component in the information handling system (using a hot swap installation or a replacement while at least some parts of the system are shut down), a software patch or upgrade, or another type of hardware or software configuration change. In some embodiments, if a re-evaluation is performed in response to a hardware configuration change (e.g., if a fan is added or replaced), the results of the analysis may be saved as new reference data with which subsequently collected data is to be compared rather than, or in addition to, being compared to the reference data collected during the training phase.

At 610, method 600 may include, for another period of time, logging the tachometer signal (in terms of RPM) while running the fan with the fixed PWM duty cycle, and then calculating and saving data representing an average RPM reading collected during the other period of time. In various embodiments, the data representing the average RPM reading collected during the other period may be stored locally (e.g., in memory subsystem 130, or local storage resource 150) or remotely (e.g., in a network storage resource accessible through network interface 160).

At 612, the method may include scaling a new set of bins to align with the reference RPM data, generating new histogram, and identifying the top bins (and the corresponding numbers of occurrences in each of the top bins or all bins) in the new histogram.

If, at 614, it is determined that the top bins and numbers of occurrences for each bin match the saved reference data, no anomalies are detected, as in 616. Otherwise, method 600 may continue at 618. At 618, the method may include identifying a potential failure or performance degradation of the given fan based on the presence of one or more new top bins and/or lower numbers of occurrences for particular bins compared to the reference data. Regardless of whether or not an anomaly was detected, method 600 may return to 608. If and when conditions indicate that it is time for a further re-evaluation, the operations shown in 610 through 618 may be repeated, as appropriate, for each successive re-evaluation.

In some embodiments, the operations of method 600 shown in FIG. 6 may be performed independently for each fan in the information handling system to detect any anomalies associated with particular ones of the fans. In some embodiments, the operations shown as 602-606 and/or 610-618 may be performed (independently) for multiple fans in parallel. In other embodiments, during the training phase or during another time period (e.g., a re-evaluation period), these operations may be performed for one fan at a time until they have been completed on all fans.

While the example method for anomaly detection for a fan based on changes in a tachometer signal received from the fan shown in FIG. 6 and described above includes providing a PWM control signal with a fixed duty cycle to the fan, in other embodiments the behavior of the fan and/or the system in which it resides, may be characterized more thoroughly by introducing perturbations in the PWM control signal and observing the resulting tachometer signal changes. For example, the behavior of a high performance fan that normally operates at a relatively low speed (e.g., with a tachometer signal and fan speed corresponding to a PWM control signal duty cycle of 10%) may be characterized by providing a PWM control signal into which higher duty cycle spikes have been introduced and observing the corresponding tachometer signal output. Alternatively, the behavior of a fan may be characterized by providing a PWM control signal for which the duty cycle is ramped up or down incrementally while the resulting tachometer signal output is observed.

Figure 7:
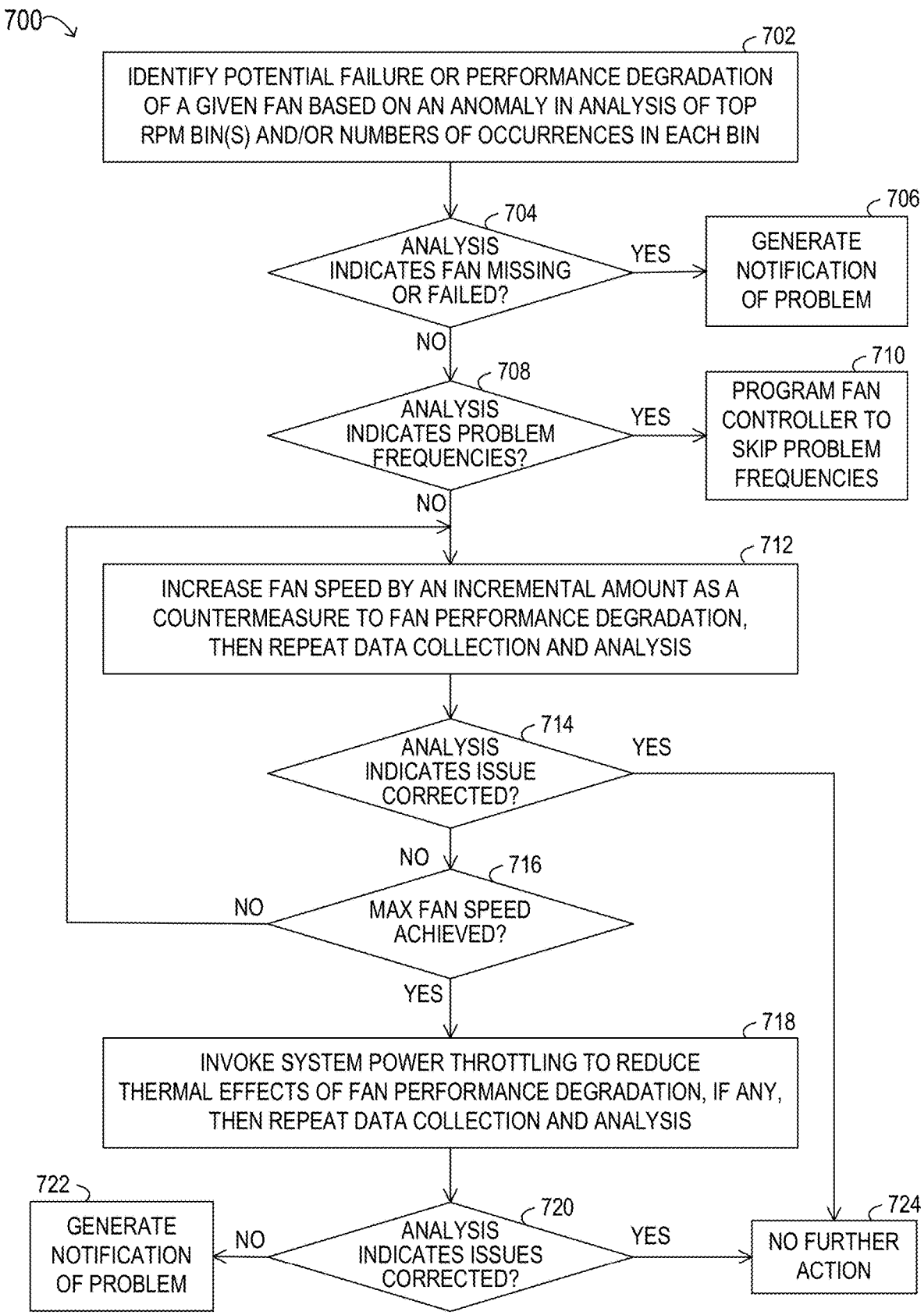
FIG. 7 is a flow diagram illustrating selected elements of an embodiment of a method for detecting and mitigating an anomaly associated with a fan in an information handling system.

In various embodiments, when an anomaly is detected for a fan, an indication of the anomaly may be provided a fan controller, such as a power/fan controller 170 illustrated in FIG. 1, a management controller residing in the power/fan controller 170, a baseboard management controller such as BMC 180, or another component of the information handling system in which the fan is installed that includes circuitry or logic affecting the operation of the fan. In response, the fan controller may react in any number of ways, in different embodiments, to further characterize or attempt to mitigate the detected anomaly. The actions taken may include but are not limited to:

- logging the detection of the anomaly in a system event log, which may provide a user with a notification of a potential problem with a particular fan
- initiating a fan speed offset, in which the fan speed is increased incrementally as a countermeasure to a potential fan failure
- setting the fan speed to its maximum value, as an alternative to an incremental system fan speed increase
- invoking system power throttling to ensure that system thermal measurements are within defined limits In FIG. 7, selected elements of an embodiment of a method 700 for detecting and mitigating an anomaly associated with a fan in an information handling system, as described herein, are depicted in flow diagram form. In some embodiments, method 700 may be performed using information handling system 100 (see FIG. 1). In some embodiments, certain operations may be performed by a baseboard management controller, such as by executing a portion of BMC firmware 184 on BMC processor 182 of BMC 180 illustrated in FIG. 1. In some embodiments, certain operations may be performed by executing, on processor subsystem 120, program instructions stored locally (e.g., in memory subsystem 130, or local storage resource 150) or remotely (e.g., in a network storage resource accessible through network interface 160). In some embodiments, certain operations may be performed by a computing device that is separate from the information handling system on whose behalf the operations are performed, e.g., as an off-line analysis of data collected during operation of the information handling system. It is noted that certain operations described in method 700 may be optional or may be rearranged in different embodiments. Method 700 may begin at 702 by identifying a potential failure or performance degradation of a given fan based on an anomaly observed in an analysis of the top RPM bins and/or numbers of occurrences in each bin of a histogram of the occurrences of RPM values in particular RPM value ranges, e.g., as illustrated in FIG. 6 and described above. For example, the presence of one or more new top bins and/or lower numbers of occurrences for particular bins compared to the reference data may indicate a potential fan problem.

In some embodiments, a potential fan problem may be indicated if the amount of the deviation from the reference data meets a particular threshold value. For example, a threshold value at which a lower number of occurrences for a particular bin is considered significant may be set at 80% of the reference data. In this example, if the number of occurrences in a particular bin is at least 20% lower than indicated in the reference data, a potential failure or performance degradation of the given fan may be identified. In another example, a threshold value at which the presence of new top bins is considered significant may be set at 20% of the reference data. In this example, if the number of top bins present in the most recently generated histogram that are not present in the reference data represents at least 20% of the number of top bins identified in the reference data, a potential failure or performance degradation of the given fan may be identified.

If, at 704, the analysis indicates that the given fan is missing altogether or has suffered a serious or fatal failure, method 700 may proceed to 706. Otherwise, the method may continue at 708. For example, if the tachometer signal for the given fan does not meet a minimum specification for all fan types, this may indicate that the fan has suffered a serious or fatal failure. If no tachometer signal is received from the fan slot in which the given fan is expected to be present, this may indicate that there is no fan in the slot. At 706, the method may include generating a notification of a potential problem with the given fan. In one example, if a potential problem with the given fan is identified, an indication of the potential problem may be provided to power/fan control module 170 (e.g., via management control bus 115). In another example, if a potential problem with the given fan is identified, data indicating the potential problem may be written to a system log or control table stored in a memory accessible by the power/fan control module 170 or stored in BMC 180, for example.

If, at 708, the analysis indicates that the fan is experiencing problems only at particular frequencies, the method may proceed to 710. Otherwise, the anomaly may indicate a more general performance degradation and the method may continue at 712. At 708, the method may include programming a fan controller to skip over the problem frequencies when ramping the PWM duty cycle up or down.

At 712, method 700 may include increasing the fan speed by an incremental amount as a countermeasure to the detected fan performance degradation issue, and then repeating the data collection and analysis described above in reference to the re-evaluation of the given fan.

If, at 714, the analysis indicates that the detected issue has been corrected, method 700 may proceed to 724, where no further action is taken. If, however, the analysis indicates that the detected issue has not been corrected, the method may continue at 716.

If, at 716, it is determined that the fan has reached its maximum speed, method 700 may continue at 718. Otherwise, the method may return to 712, after which the fan speed may be further reduced one or more times in an attempt to correct the detected issue, as in operations 714 and 716.

At 718, the method may include invoking system power throttling to reduce the thermal effects of the detected fan performance degradation issue, if any, and then repeating the data collection and analysis to determine whether the detected issue (whether includes a performance issue, a thermal issue, or both) has been corrected.

If, at 720, the analysis indicates that the detected issue has been corrected, method 700 may proceed to 724, at which point no further action is necessary. However, if the analysis indicates that the detected issue has still not been resolved, the method may proceed to 722, after which a notification of the potential problem may be generated. In some embodiments, an indication of the potential problem may be provided to power/fan control module 170 (e.g., via management control bus 115). In another example, data indicating the potential problem may be written to a system log or control table stored in a memory accessible by the power/fan control module 170 or stored in BMC 180, for example.

While the example method for detecting and mitigating an anomaly associated with a fan in an information handling system illustrated in FIG. 7 includes incrementally increasing the fan speed prior until it reaches its maximum speed, in other embodiments, the fan speed may be increased to its maximum speed with first attempting to mitigate the detected anomaly through incremental speed increases. In still other embodiments, power throttling may be invoked before, at the same time as, during, or instead of an attempt to mitigate the detected anomaly through incremental speed increases or setting the fan speed to it maximum speed.

Experiments have been performed to evaluate the anomaly detection techniques illustrated in FIG. 7 and described above. In one experiment, tachometer readings were collected for a fan during normal operation and again when the fan was disturbed in ways that simulate various fan failure conditions, such as wobbling. In this experiment, the tachometer signal output was logged using a logic analyzer, and the response of the intentionally wobbled fan was analyzed.

Figure 8:
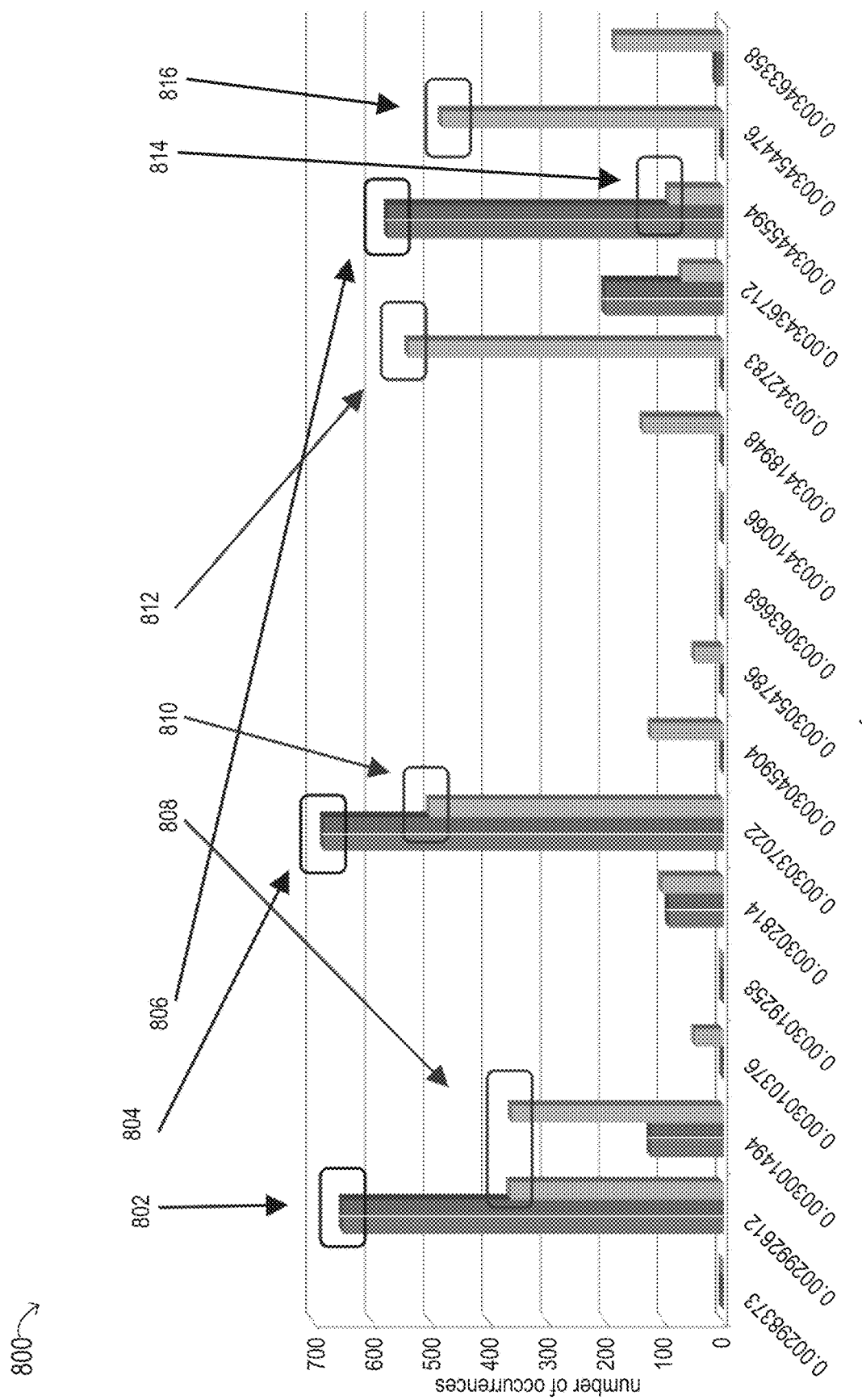
FIG. 8 is a graphical representation of multiple histograms in which tachometer signal readings are plotted against different duty cycles, according to some embodiments.

FIG. 8 is a graphical representation 800 of multiple histograms in which tachometer signal readings (in terms of RPM) collected during various experiments are plotted against different duty cycles (in terms of percentage), as described above, for different conditions. The first set of histograms, represented in FIG. 8 by the left-most column in each grouping of three columns, was generated from tachometer readings taken during normal operation of a particular fan and are used as baseline measurements. The second set of histograms, represented in FIG. 8 by the middle column in each grouping of three columns, was generated from tachometer readings taken under a first test condition, in which fan blades were touched with 28 gauge (AWG) wire. The third set of histograms, represented in FIG. 8 by the right-most column in each grouping of three columns, was generated from tachometer readings taken under a second test condition, in which one fan blade was broken off.

Selected portions of the data logged during the experiments are shown in Table 1 below. Each log includes, for a particular one of the three conditions described above, entries including the respective histogram bins and the numbers of occurrences (data points) in each bin. The raw data collected from the logic analyzer also included timestamps and the state of the tachometer (1 or 0) (not shown). In Table 1 below, the value shown for a given bin represents the upper boundary of the given bin and the lower boundary of the given bin is the value shown for the previous bin.

TABLE 1

Histogram Data

| BASELINE | | TEST CONDITION 1 | | TEST CONDITION 2 | |
| --- | --- | --- | --- | --- | --- |
| bin | occur-rences | bin | occur-rences | bin | occur-rences |
| 0.002984 | 1 | 0.002984 | 1 | 0.002963 | 1 |
| 0.002993 | 650 | 0.002993 | 650 | 0.002972 | 364 |
| 0.003001 | 124 | 0.003001 | 124 | 0.002982 | 362 |
| 0.00301 | 0 | 0.00301 | 0 | 0.002991 | 48 |
| 0.003019 | 0 | 0.003019 | 0 | 0.003 | 0 |
| 0.003028 | 93 | 0.003028 | 93 | 0.003009 | 104 |
| 0.003037 | 683 | 0.003037 | 683 | 0.003019 | 501 |
| 0.003046 | 0 | 0.003046 | 0 | 0.003028 | 122 |
| 0.003055 | 0 | 0.003055 | 0 | 0.003037 | 48 |
| 0.003064 | 0 | 0.003064 | 0 | 0.003046 | 0 |
| 0.00341 | 0 | 0.00341 | 0 | 0.003406 | 0 |
| 0.003419 | 0 | 0.003419 | 0 | 0.003415 | 136 |
| 0.003428 | 0 | 0.003428 | 0 | 0.003425 | 538 |
| 0.003437 | 202 | 0.003437 | 202 | 0.003434 | 70 |
| 0.003446 | 573 | 0.003446 | 573 | 0.003443 | 93 |
| 0.003454 | 0 | 0.003454 | 0 | 0.003452 | 481 |
| 0.003463 | 12 | 0.003463 | 12 | 0.003462 | 185 |

During normal operation, shown as the baseline condition in Table 1 above, the top bins (e.g., those having the highest number of occurrences) include 650, 683, and 573 occurrences, respectively. These bins are identified in FIG. 8 by the labels 802, 804, and 806, respectively. The data collected for test case 1, in which fan blades were touched with a thin wire, was the same as in the baseline case. In this experiment, touching the fan blades with a thin wire did not affect the tachometer signal output because the fan rotors were heavy enough to resist any change due to the wire.

In the data collected for test case 2, in which one fan blade was broken off, there were several new top bins and lowered numbers of occurrences (data points) in some bins when compared with the baseline data. Some of these differences are identified in FIG. 8 by the labels 808, 810, 812, 814 and 816. For example, the top three bins for test case 2 include 538, 501, and 48 occurrences, respectively. These bins are identified in FIG. 8 by the labels 812, 810, and 816, respectively. Bins with significantly altered numbers of occurrences compared to the baseline case include those bins labeled collectively as 808 (one of which has a lower number of occurrences than in the baseline case and one of which has a higher number of occurrences than in the baseline case), and the bins labeled as 810 and 814 (each of which has a lower number of occurrences than in the baseline case). In this experiment, the broken fan blade affected the behavior of the fan enough for the changes to be reflected in the tachometer signal output. More specifically, with one blade missing (and a corresponding lighter load on the fan), bins shifted down slightly, indicating that the fan sped up slightly. The new top bins are indicative of vibrations due to the fan being out of balance and uneven pressures as the blades pass the stationary plastic parts. These experiments show that the anomaly detection techniques described herein may be useful in identifying fan damage or other anomalies that affect the performance of a fan in an information handling system.

As described above, an information handling system may, in some embodiments, implement systems and methods for fan typing and anomaly detection based on the expected and observed relationships between tachometer signal outputs and PWM control signal inputs, and deviations therefrom. These techniques do not require dedicated circuitry for fan typing nor a dedicated fan type pin (and associated wiring), as is the case with existing solutions. This provides technical benefits by reducing the amount and complexity of the circuitry needed to perform fan typing and anomaly detection and the corresponding financial benefits of reducing the board space and number components (e.g., circuitry and connectors) needed to implement this functionality.

The software based fan typing and anomaly detection approaches described herein may be performed in an unobtrusive manner (e.g., in terms of power and/or sound) during a system boot phase and during runtime rediscovery following a configuration change in the system, such as through hot-plugging or a software upgrade. The systems described herein may include a BMC subsystem that uses tachometer signal interrupts to calculate tachometer signal jitter and a subsequent determination of asymmetric fan wobble corresponding to the tachometer signal jitter. In some embodiments, the systems and methods described herein may use calculated fan wobble rates to determine the actual vibration signature of a fan, and may inform control mechanism that skip over certain PWM duty cycle points at which potential problems (such as for drive throughput) were identified using calculation of excursions such as wobble.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An information handling system, comprising:
at least one processor; and
a memory medium coupled to the at least one processor and storing program instructions that, when executed by the at least one processor, cause the information handling system to:
supply a pulse width modulation (PWM) control signal with a first PWM duty cycle to an input of a given fan, the first PWM duty cycle being greater than or equal to a predetermined confidence threshold duty cycle;
receive a tachometer signal output by the given fan while the PWM control signal has the first PWM duty cycle, the tachometer signal comprising a pair of pulses for each rotation of the given fan such that the frequency of the tachometer signal expressed in terms of revolutions per minute (RPM) is proportional to the speed of the given fan;
compare the frequency of the tachometer signal output by the given fan while the PWM control signal has the first PWM duty cycle to an expected tachometer frequency for fans of a first fan type when receiving a PWM control signal of the first PWM duty cycle;
responsive to determining, based on the comparison, that the given fan is a fan of the first fan type, provide an indication that the given fan is a fan of the first fan type to a fan controller;
calculate a first average frequency of the tachometer signal output by the given fan during a first time period in which the PWM control signal has the first PWM duty cycle;
generate a first data structure representing a histogram comprising multiple bins, wherein each bin represents a respective range of tachometer frequency values for the tachometer signal output by the given fan during the first time period and each bin is associated with a respective count value indicating the number of occurrences of a tachometer frequency value for the tachometer signal falling within the respective range of tachometer frequency values represented by the bin during the first time period;
determine a predetermined number of top bins associated with the highest respective count values in the first data structure;
save reference data representing one or more of the calculated average frequency, identifiers of the top bins in the first data structure, and the respective count values associated with the top bins;
calculate a second average frequency of the tachometer signal output by the given fan during a second time period in which the PWM control signal has the first PWM duty cycle;
generate a second data structure representing a histogram comprising multiple bins, wherein each bin represents a respective range of tachometer frequency values for the tachometer signal output by the given fan during the second time period and each bin is associated with a respective count value indicating the number of occurrences of a tachometer frequency value for the tachometer signal falling within the respective range of tachometer frequency values represented by the bin during the second time period;
determine a predetermined number of top bins associated with the highest respective count values in the second data structure;
compare data representing one or more of the calculated second average frequency, identifiers of the top bins in the second data structure, and the respective count values associated with the top bins in the second data structure to the saved reference data; and
responsive to detecting a discrepancy between the data representing the calculated second average frequency, identifiers of the top bins in the second data structure, or the respective count values associated with the top bins in the second data structure and the saved reference data, provide an indication of an anomaly associated with the given fan to the fan controller.

2. The information handling system of claim 1, wherein the expected tachometer frequency is dependent on a curve specified for fans of the first fan type on which tachometer frequency values expressed in terms of revolutions per minute are plotted against PWM duty cycle values.

3. The information handling system of claim 1, wherein when executed by the at least one processor, the program instructions further cause the information handling system to:
responsive to determining, based on the comparison, that the given fan is not a fan of the first fan type:
compare, in a second comparison, the frequency of the tachometer signal output by the given fan while the PWM control signal has the first PWM duty cycle to an expected tachometer frequency for fans of a second fan type when receiving a PWM control signal of the first PWM duty cycle; and
responsive to determining, based on the second comparison, that the given fan is a fan of the second fan type, provide an indication that the given fan is a fan of the second fan type to the fan controller.

4. The information handling system of claim 1, wherein:
the information handling system further comprises a plurality of fan slots, each fan slot being configured for installation of a respective fan into the fan slot;
the given fan is installed in a first one of the plurality of fan slots; and
when executed by the at least one processor, the program instructions further cause the information handling system to:
compare the frequency of the tachometer signal output by the given fan while the PWM control signal has the first PWM duty cycle to a minimum tachometer frequency for fans of multiple fan types; and
responsive to determining that the frequency of the tachometer signal output by the given fan while the PWM control signal is less than the minimum tachometer frequency for fans of multiple fan types, provide an indication of a potential failure or performance degradation of the given fan to the fan controller.

5. A method for fan typing and anomaly detection, comprising:
causing a pulse width modulation (PWM) control signal with a first PWM duty cycle to be provided to an input of a first fan, the first PWM duty cycle being greater than or equal to a predetermined confidence threshold duty cycle;
receiving a tachometer signal output by the first fan while the PWM control signal has the first PWM duty cycle, the tachometer signal comprising a pair of pulses for each rotation of the first fan such that the frequency of the tachometer signal expressed in terms of revolutions per minute (RPM) is proportional to the speed of the first fan;
comparing the frequency of the tachometer signal output by the first fan while the PWM control signal has the first PWM duty cycle to an expected tachometer frequency for fans of a first fan type when receiving a PWM control signal of the first PWM duty cycle;
determining, based on the comparison, whether or not the first fan is a fan of the first fan type;
providing an indication of whether or not the first fan is a fan of the first fan type to a fan controller;
calculating a first average frequency of the tachometer signal output by the first fan during a first time period in which the PWM control signal has the first PWM duty cycle;
generating a first data structure representing a histogram comprising multiple bins, wherein each bin represents a respective range of tachometer frequency values for the tachometer signal output by the first fan during the first time period and each bin is associated with a respective count value indicating the number of occurrences of a tachometer frequency value for the tachometer signal falling within the respective range of tachometer frequency values represented by the bin during the first time period,
determining a predetermined number of top bins associated with the highest respective count values in the first data structure;
saving reference data representing one or more of the calculated average frequency, identifiers of the top bins in the first data structure, and the respective count values associated with the top bins;
calculating a second average frequency of the tachometer signal output by the first fan during a second time period in which the PWM control signal has the first PWM duty cycle;
generating a second data structure representing a histogram comprising multiple bins, wherein each bin represents a respective range of tachometer frequency values for the tachometer signal output by the first fan during the second time period and each bin is associated with a respective count value indicating the number of occurrences of a tachometer frequency value for the tachometer signal falling within the respective range of tachometer frequency values represented by the bin during the second time period;
determining a predetermined number of top bins associated with the highest respective count values in the second data structure;
comparing data representing one or more of the calculated second average frequency, identifiers of the top bins in the second data structure, and the respective count values associated with the top bins in the second data structure to the saved reference data; and
in response to detecting a discrepancy between the data representing the calculated second average frequency, identifiers of the top bins in the second data structure, or the respective count values associated with the top bins in the second data structure and the saved reference data, providing an indication of an anomaly associated with the first fan to the fan controller.

6. The method of claim 5, wherein:
the first fan type is an expected fan type for the first fan; and
the method further comprises:
obtaining an identifier associated with a hardware configuration of the information handling system; and
determining the expected fan type based on the obtained identifier.

7. The method of claim 5, further comprising:
in response to determining that the first fan is not a fan of the first fan type:
comparing, by a second comparison, the frequency of the tachometer signal output by the first fan while the PWM control signal has the first PWM duty cycle to an expected tachometer frequency for fans of a second fan type when receiving a PWM control signal of the first PWM duty cycle; and
in response to determining, based on the second comparison, that the first fan is a fan of the second fan type, providing an indication that the first fan is a fan of the second fan type to the fan controller.

8. The method of claim 5, further comprising:
determining that the anomaly associated with the first fan represents a failure or performance degradation of the first fan; and
taking corrective action to mitigate the anomaly.

9. The method of claim 5, further comprising:
determining that the anomaly associated with the first fan is frequency-specific; and
configuring the fan controller to avoid one or more frequencies associated with the anomaly.

10. The method of claim 5, further comprising, subsequent to determining that the first fan is a fan of the first fan type:
causing a pulse width modulation (PWM) control signal with a second PWM duty cycle to be provided to an input of a second fan, the second PWM duty cycle being greater than or equal to the predetermined confidence threshold duty cycle;
receiving a tachometer signal output by the second fan while the PWM control signal has the second PWM duty cycle;
comparing, in a second comparison, the frequency of the tachometer signal output by the second fan to an expected tachometer frequency for fans of a second fan type when receiving a PWM control signal of the second PWM duty cycle;
determining, based on the second comparison, that the second fan is a fan of the second fan type; and
providing an indication that the second fan is a fan of the second fan type to the fan controller.

11. The method of claim 5, further comprising:
prior to comparing the frequency of the tachometer signal output by the first fan to the expected tachometer frequency, ramping the PWM duty cycle of the PWM control signal up to the predetermined confidence threshold duty cycle from an initial lower duty cycle; and
subsequent to comparing the frequency of the tachometer signal output by the first fan to the expected tachometer frequency, returning the PWM control signal to the initial lower duty cycle.

12. The method of claim 5, wherein causing the PWM control signal with the first PWM duty cycle to be provided to the input of the first fan, receiving the tachometer signal output by the first fan, comparing the frequency of the tachometer signal output by the first fan to the expected tachometer frequency, determining whether or not the first fan is a fan of the first fan type, and providing the indication of whether or not the first fan is a fan of the first fan type to a fan controller are performed in response to an initiation of a power-on-self-test or a change in a hardware configuration of the information handling system.

13. A non-transitory, computer-readable memory medium including instructions that, when executed by at least one processor of an information handling system, cause the information handling system to:
provide a pulse width modulation (PWM) control signal with a first PWM duty cycle to an input of a given fan, the first PWM duty cycle being greater than or equal to a predetermined confidence threshold duty cycle;
receive a tachometer signal output by the given fan while the PWM control signal has the first PWM duty cycle, the tachometer signal comprising a pair of pulses for each rotation of the given fan such that the frequency of the tachometer signal expressed in terms of revolutions per minute (RPM) is proportional to the speed of the given fan;
compare the frequency of the tachometer signal output by the given fan while the PWM control signal has the first PWM duty cycle to an expected tachometer frequency for fans of a first fan type when receiving a PWM control signal of the first PWM duty cycle;
determine, based on the comparison, whether or not the given fan is a fan of the first fan type;
provide an indication of whether or not the given fan is a fan of the first fan type to a fan controller;
calculate a first average frequency of the tachometer signal output by the given fan during a first time period in which the PWM control signal has the first PWM duty cycle;
generate a first data structure representing a histogram comprising multiple bins, wherein each bin represents a respective range of tachometer frequency values for the tachometer signal output by the given fan during the first time period and each bin is associated with a respective count value indicating the number of occurrences of a tachometer frequency value for the tachometer signal falling within the respective range of tachometer frequency values represented by the bin during the first time period;
determine a predetermined number of top bins associated with the highest respective count values in the first data structure;
save reference data representing one or more of the calculated average frequency, identifiers of the top bins in the first data structure, and the respective count values associated with the top bins;
calculate a second average frequency of the tachometer signal output by the given fan during a second time period in which the PWM control signal has the first PWM duty cycle;
generate a second data structure representing a histogram comprising multiple bins, wherein each bin represents a respective range of tachometer frequency values for the tachometer signal output by the given fan during the second time period and each bin is associated with a respective count value indicating the number of occurrences of a tachometer frequency value for the tachometer signal falling within the respective range of tachometer frequency values represented by the bin during the second time period;
determine a predetermined number of top bins associated with the highest respective count values in the second data structure;
compare data representing one or more of the calculated second average frequency, identifiers of the top bins in the second data structure, and the respective count values associated with the top bins in the second data structure to the saved reference data; and
responsive to detecting a discrepancy between the data representing the calculated second average frequency, identifiers of the top bins in the second data structure, or the respective count values associated with the top bins in the second data structure and the saved reference data, provide an indication of an anomaly associated with the given fan to the fan controller.

14. The non-transitory, computer-readable memory medium of claim 13, wherein when executed by the at least one processor, the instructions further cause the information handling system to:
responsive to determining, based on the comparison, that the given fan is not a fan of the first fan type:
compare, in a second comparison, the frequency of the tachometer signal output by the given fan while the PWM control signal has the first PWM duty cycle to an expected tachometer frequency for fans of a second fan type when receiving a PWM control signal of the first PWM duty cycle; and responsive to determining, based on the second comparison, that the given fan is a fan of the second fan type, provide an indication that the given fan is a fan of the second fan type to the fan controller.

\* \* \* \* \*